US011296704B2

(12) United States Patent
Akaho

(10) Patent No.: US 11,296,704 B2
(45) Date of Patent: Apr. 5, 2022

(54) POWER CONTROL DEVICE, DRIVING MODULE AND SWITCHING POWER SUPPLY DEVICE

(71) Applicant: Rohm Co., Ltd., Kyoto (JP)

(72) Inventor: Tadashi Akaho, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 17/328,864

(22) Filed: May 24, 2021

(65) Prior Publication Data

US 2021/0384910 A1 Dec. 9, 2021

(30) Foreign Application Priority Data

Jun. 4, 2020 (JP) .............................. JP2020097548

(51) Int. Cl.
*H02M 3/335* (2006.01)
*H03K 19/0948* (2006.01)
*H03K 19/17772* (2020.01)
*H02M 3/158* (2006.01)

(52) U.S. Cl.
CPC ... *H03K 19/0948* (2013.01); *H03K 19/17772* (2013.01); *H02M 3/1584* (2013.01)

(58) Field of Classification Search
CPC ..................... H03K 19/0948; H03K 19/17772
See application file for complete search history.

(56) References Cited

U.S. PATENT DOCUMENTS

2009/0146631 A1* 6/2009 Fukumori ........... H02M 3/1588 323/284
2009/0174384 A1* 7/2009 Michishita ............ H02M 3/158 323/285
2009/0322299 A1* 12/2009 Michishita ............ H02M 3/156 323/282
2015/0381040 A1* 12/2015 Uan-Zo-Li .......... H02M 3/1584 323/271
2016/0322808 A1* 11/2016 Jiang ...................... G01R 27/00
2020/0186042 A1* 6/2020 Akaho ................ H02M 1/0035

FOREIGN PATENT DOCUMENTS

JP 2017-195768 10/2017

* cited by examiner

*Primary Examiner* — Kurtis R Bahr
(74) *Attorney, Agent, or Firm* — Fish & Richardson P.C.

(57) ABSTRACT

The present disclosure relates to a power control device, a driving module and a switching power supply device. The power control device includes: a control terminal, configured to input and output a control signal to and from the driving module; an enable output terminal, configured to output an enable signal to the driving module; a control circuit; and an input/output circuit, configured to have the control signal be a first logic level when the output transistor is turned on and the synchronous rectifier transistor is turned off, and to have the control signal be a second logic level when the output transistor is turned off and the synchronous rectifier transistor is turned on, and to be able to become an input standby state according to an instruction from the control circuit.

12 Claims, 10 Drawing Sheets

POWER CONTROL DEVICE, DRIVING MODULE AND SWITCHING POWER SUPPLY DEVICE

BACKGROUND OF THE INVENTION

Field of the Invention

The present disclosure relates to a driving module for a switching power supply device and a power control device.

Description of the Prior Art

In the recent years, driving modules (the so-called "DrMOS (driver metal-oxide-semiconductor field-effect transistors")), as a component of the switching power supply device, are extensively applied. A driving module integrates a pair of MOSFETs forming a switching output stage and a driving logic circuit for driving the pair of MOSFETs into one package.

Moreover, an example of the prior art related to the described contents may be referred to citation document 1.

PRIOR ART DOCUMENT

Citation Document

[Citation document 1] Japan Patent Publication No. 2017-195768

SUMMARY

Problems to be Solved by the Invention

Conventionally, the driving module is controlled by a power control device. The power control device includes a control terminal. The driving logic circuit drives turning on/off of the MOSFET according to a logic level of a control signal outputted by the control terminal.

Herein, it is expected that upon start of a switching power supply device, the power control device can verify the model number of the driving module connected to the control terminal, or whether there is a poor connection in the control terminal. At this point in time, it is required to suppress the increase in the number of terminals of the power control device.

In view of the situation above, it is an object of the present disclosure to provide a power control device, a driving module and a switching power supply device capable of suppressing the increase in the number of terminals and achieving a connection-related verification function of a control terminal of the power control device.

Technical Means for Solving the Problem

The power control device of the present disclosure is used with a driving module that drives an output transistor and a synchronous rectifier transistor to turn on or off, and is in the following configuration (first configuration).

That is, the power control device includes: a control terminal, configured to input and output a control signal to and from the driving module; an enable output terminal, configured to output an enable signal to the driving module; a control circuit; and an input/output circuit, configured to have the control signal be a first logic level when the output transistor is turned on and the synchronous rectifier transistor is turned off, and to have the control signal be a second logic level when the output transistor is turned off and the synchronous rectifier transistor is turned on, and to be in an input standby state according to an instruction from the control circuit.

The control circuit is configured to activate the enable signal at a level of the driving module to be transmitted to the driving module to verify whether the control signal is at a third logic level that is neither the first logic level nor the second logic level when the input/output circuit is in the input standby state.

Further, the power control device may also be in the following configuration (second configuration). That is, in the first configuration, the enable signal is configured to be any one of an L (low) level, an H (high) level or an M level between the L level and the H level to activate the level of the driving module to be the M level.

Further, the power control device may also be in the following configuration (third configuration). That is, in the first or second configuration, when the input/output circuit is in the input standby state and the enable signal is at a level representing disablement, after the control circuit verifies that the control signal has become the first logic level or the second logic level, the control circuit is configured to activate the enable signal at the level of the driving module to be transmitted to the driving module.

Further, the power control device may also be in the following configuration (fourth configuration). That is, in the third configuration, the control terminal is plural in quantity, and when the input/output circuit is in the input standby state and the enable signal is at the level representing disablement, the control circuit verifies whether a combination of the level of the control signal is consistent with a permitted combination.

Further, the power control device may also be in the following configuration (fifth configuration). That is, in the fourth configuration, an application terminal of a voltage at the third logic level is configured to be connected to the control terminal that is not used for connection with the driving module.

Further, the power control device may also be in the following configuration (sixth configuration). That is, in any one of the first to fifth configurations, the enable output terminal is plural in quantity, and the control terminal is plural in quantity.

Further, the driving module of the present disclosure drives an output transistor and a synchronous rectifier transistor to turn on or off, and is in the following configuration (seventh configuration). The driving module is integrated in a single package and includes: a driving logic circuit, configured to turn on the output transistor and to turn off the synchronous rectifier transistor when the control signal is at a first logic level, and to turn off the output transistor and to turn on the synchronous rectifier transistor when the control signal is at a second logic level; an internal voltage generating section, generating an internal voltage and activated by an enable signal; a power-on reset section, releasing reset of the driving logic circuit according to the internal voltage; and a logic level switching circuit, switching the control signal to a third logic level that is neither the first logic level nor the second logic level according to an instruction from the driving logic circuit when the reset is released.

Further, the power control device may also be in the following configuration (eighth configuration). That is, in the seventh configuration, the logic level switching circuit includes: a first P-channel MOS transistor, having a gate driven based on the enable signal, and a source connected to an application terminal of a power voltage; a resistor, having a first terminal connected to a drain of the first P-channel MOS transistor; a second P-channel MOS transistor, having a source connected to a second terminal of the resistor, a drain connected to an application terminal of a ground voltage, and a gate driven by the internal voltage; an N-channel MOS transistor, having a gate connected to a connecting node of the second terminal of the resistor and the source of the second P-channel MOS transistor, and a source connected to an application terminal of the control signal; and a third P-channel MOS transistor, having a source connected to the application terminal of the power voltage, a drain connected to the drain of the N-channel MOS transistor, and a gate applied with a gate signal outputted from the driving logic circuit.

Further, the power control device may also be in the following configuration (ninth configuration). That is, in the seventh or eighth configuration, the power control device further includes a logic level fixing circuit. The logic level fixing circuit fixes the control signal at the logic level of each model number when the enable signal represents disablement.

Further, the power control device may also be in the following configuration (tenth configuration). That is, in any one of the seventh to ninth configurations, the power control device further includes a zero-crossing detection circuit. The zero-crossing detection circuit detects zero-crossing of a flowing inductor current when the synchronous rectifier transistor is turned on, and the logic level switching circuit switches the control signal to the third logic level according to the instruction from the driving logic circuit upon detection of zero-crossing.

Further, the power control device may also be in the following configuration (eleventh configuration). That is, in any one of the seventh to tenth configurations, the power control device is integrated in a package including the output transistor and the synchronous rectifier transistor.

Further, a switching power supply device of the present disclosure includes a driving module and a power control device. The driving module drives an output transistor and a synchronous rectifier transistor to turn on or off and includes the following configuration. The power control device includes: a control terminal, configured to input and output a control signal to and from the driving module; an enable output terminal, configured to output the enable signal to the driving module; a control circuit; and an input/output circuit, configured to have the control signal be a first logic level or a second logic level in order to turn on or turn off the output transistor and the synchronous rectifier transistor, and to be in an input standby state according to an instruction from the control circuit; the control circuit is configured to transmit an enable signal at a level for activating the driving module to the driving module when the input/output circuit is in the input standby state, and to verify whether the control signal is at a third logic level that is neither the first logic level nor the second logic level; the driving module integrated in a single package includes: a driving logic circuit, configured to turn on the output transistor and to turn off the synchronous rectifier transistor when the control signal is at the first logic level, and to turn off the output transistor and to turn on the synchronous rectifier transistor when the control signal is at the second logic level; an internal voltage generating section, generating an internal voltage, activated by the enable signal; a power-on reset section, releasing reset of the driving logic circuit according to the internal voltage; and the logic level switching circuit, switching the control signal to the third logic level according to the instruction from the driving logic circuit when the reset is released.

Effects of the Invention

The present disclosure implements a connection-related verification function of a control terminal of the power control device while suppressing an increase in the number of terminals.

DETAILED DESCRIPTION OF THE EMBODIMENTS

<Overall Configuration of a Switching Power Supply Device>

Figure 1:
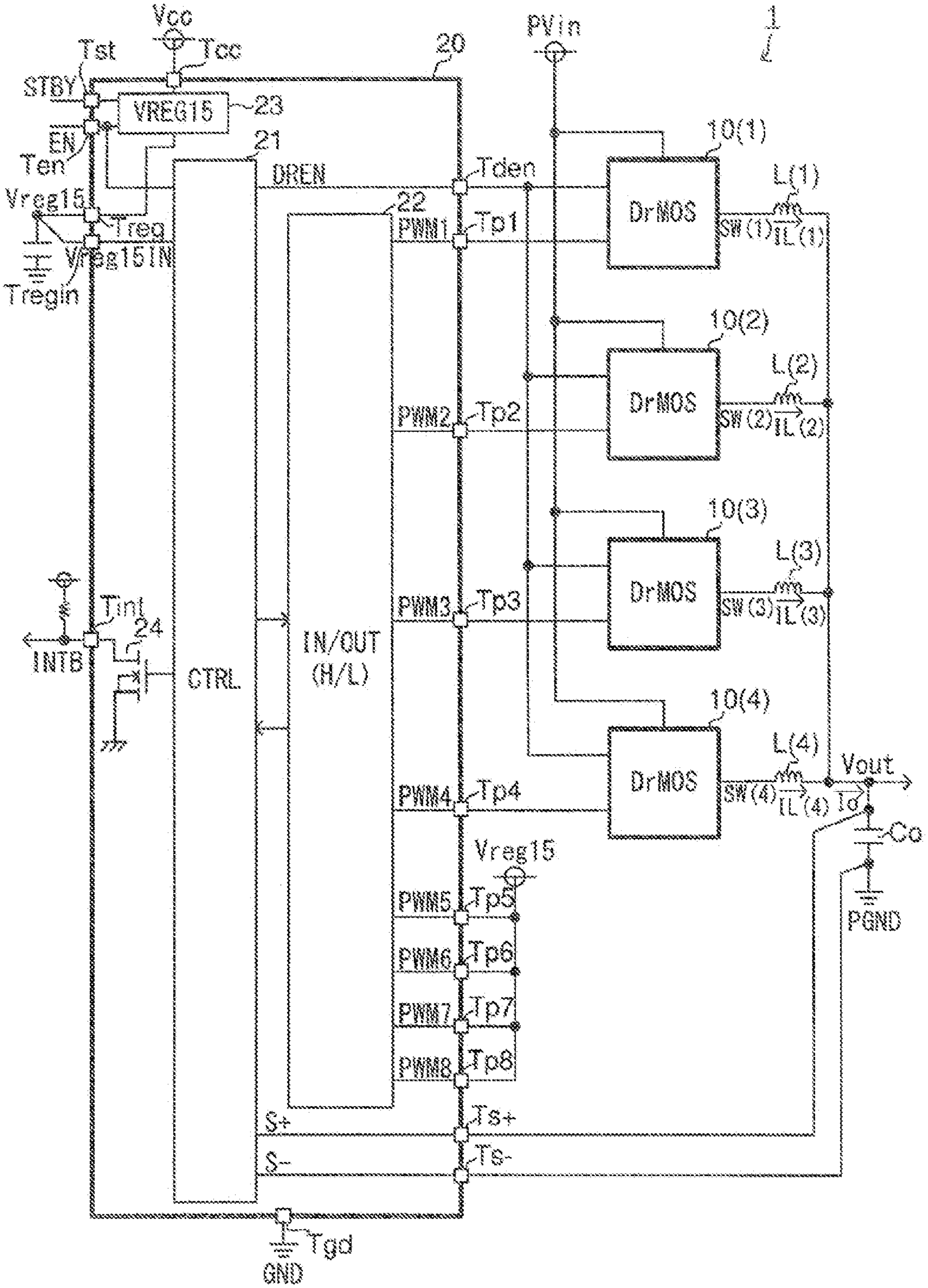
FIG. 1 is a diagram of an overall configuration of a switching power supply device according to an exemplary embodiment.

FIG. 1 shows a diagram of an overall configuration of a switching power supply device. A switching power supply device 1 of this configuration example is a multi-phase (four-phase in this diagram) step-down direct-current-to-direct-current (DC/DC) converter. An output voltage Vout is generated from an input voltage Pvin and is supplied to a load Z (not shown, for example, a central processing unit (CPU)), and includes four phases of driving modules 10(1) to 10(4) connected in parallel, a power control device 20, inductors L1(1) to L1(4), and a capacitor Co.

Moreover, the power control device 20 is described below, that is, including control terminals Tp1 to Tp8, and one to eight driving modules 10 are connected to the power control device 20 according to a connection form of the driving modules 10. That is to say, a one-phase to eight-phase step-down DC/DC converter can be formed. In FIG. 1, as an example, the control terminals Tp1 to Tp4 are used to connect to the driving module 10, and the other control terminals Tp5 to Tp8 are not used.

The driving modules 10(1) to 10(4) are semiconductor devices (the so-called DrMOS) in which a pair of MOSFETs forming a switching output stage and a driving logic circuit (neither shown) for driving the pair of MOSFETs are integrated in one package, respectively.

The pair of MOSFETs are connected between an application terminal of the input voltage Pvin and an application terminal of a ground voltage PGND, and are fundamentally controlled to be turned on/off according to control signals PWM1 to PWM4. As a result, switching voltages SW(1) to SW(4) driven by pulses between the input voltage Pvin and the ground voltage PGND are outputted from the driving modules 10(1) to 10(4), and these switching voltages are accumulated, rectified and smoothed using the inductors L(1) to L(4) and the capacitor Co, accordingly, generating the output voltage Vout inputted to the load Z.

Further, by using the driving modules 10(1) to 10(4), compared to a situation where a pair of MOSFETs or a driving logic circuit is individually provided, the circuit scale of the switching power supply device 1 can be significantly reduced.

The power control device 20 is a semiconductor device (the so-called power management integrated circuit (PMIC)) serving as a control body of the switching power supply device 1. The power control device 20 is integrated in one package including a control circuit 21, an input/output circuit 22, an internal voltage generating section 23 and a MOS switch 24.

Further, the power control device 20 includes control terminals Tp1 to Tp8, an enable output terminal Tden, a driving input terminal Ten, a standby terminal Tst, an internal voltage output terminal Treg, an internal voltage input terminal Tregin, an interrupt terminal Tint, feedback input terminal Ts+ and Ts−, a power terminal Vcc and a ground terminal Tgd, and external terminals for establishing electrical connections to the exterior.

The control circuit 21 is a body that performs output feedback control on the control signal PWM in order to acquire the desired output voltage Vout from the input voltage Pvin. The control circuit 21 provides an instruction to the input/output circuit 22 according to a voltage between two terminals (=a difference between remote sensing signals S+ and S−) of the load Z detected by means of remote sensing, so that the input/output circuit 22 generates respective control signals PWM(1) to PWM(4) of the driving modules 10(1) to 10(4) to perform the output feedback control. The remote sensing signals S+ and S− are inputted to the feedback input terminals Ts+ ad Ts−. The generated control signals PWM(1) to PWM(4) are outputted to the driving modules 10(1) to 10(4) from the control terminals Tp1 to Tp4.

The control circuit 21 further has the following function (with the details to be described below), that is, having the input/output circuit 22 be in an input standby state, monitoring the logic level of the control signal PWM, switching an operation mode of the switching power supply device 1 according to the monitoring result, or determining the model number or the connection of the driving module 10.

The input/output circuit 22 is a circuit block that performs input and output of the control signal PWM, and switches the operation state (an output state or an input standby state) thereof according to the instruction from the control circuit 21. When the input/output circuit 22 is in the output state, the input/output circuit 22 outputs the control signal PWM at a high (H) level or at a low (L) level, and accordingly controls turning on/off of a pair of MOSFETs (to be described below) included in the driving module 10. On the other hand, when the input/output circuit 22 is in the input standby state, the input/output circuit 22 detects the logic level (H/L/M (middle)) of the control signal PWM, and outputs the detection result thereof to the control circuit 21 (with the details to be described below).

The control circuit 21 further has a function of outputting an enable signal DREN of three values (H/M/L) common to each of the driving modules 10(1) to 10(4). The enable signal DREN is outputted from the enable output terminal Tden to the driving modules 10(1) to 10(4).

When DREN=L (e.g., GND), the driving modules 10(1) to 10(4) are disabled.

When DREN=H (e.g., Vcc), the driving modules 10(1) to 10(4) are activated in a first operation mode (=an operation mode in which pulse driving of the switching voltages SW(1) to SW(4) is always performed corresponding to the control signals PWM1 to PWM4).

Further, when DREN=M (e.g., Vcc/2), the driving modules 10(1) to 10(4) are activated in a second operation mode (=an operation mode in which the control signals PWM(1) to PWM(4) are automatically switched to the M level, and the switching voltages SW(1) to SW(4) are automatically in an output high-impedance state (HiZ), during zero-crossing detection of the inductor currents IL(1) to IL(4)).

The control circuit 21 further has the following function (with the details to be described below): when DREN=L or DREN=M, appropriately having the input/output circuit 22 be in an input standby state of the control signals PWM1 to PWM4, detecting the logic levels, and accordingly performing a transfer from a heavy-load mode (a pulse-width modulation (PWM) mode) to a light-load mode (a pulse frequency modulation (PFM) mode), or determining the model numbers or the connections of the driving modules 10(1) to 10(4).

Further, the internal voltage generating section 23 is a circuit that generates and outputs an internal voltage Vreg15 based on the power voltage Vcc applied to the power terminal Tcc, and for example, includes a low-dropout (LDO). As an example, Vcc=3 V, and in comparison, Vreg=1.5 V. The internal voltage Vreg15 is outputted to the exterior from the internal voltage output terminal Treg. Further, the internal voltage Vreg15 outputted to the exterior is inputted to the internal voltage input terminal Tregin and supplied to the control circuit 21.

The MOS switch 24 includes an NMOS transistor. The source of the MOS switch 24 is connected to an application terminal of the ground voltage GND, and the drain of the MOS switch 24 is connected to the interrupt terminal Tint. The interrupt terminal Tint is then pulled up. Turning on/off of the MOS switch 24 is controlled by the control circuit 21. When the MOS switch 24 is turned off, an interrupt signal INTB generated by the interrupt terminal Tint is at the H level; when the MOS switch 24 is turned on, the interrupt signal INTB is at the L level. The control circuit 21 can inform the exterior of an abnormal state by means of the interrupt signal INTB. In an abnormal state, for example, the interrupt signal INTB is at the L level.

Respective first terminals of the inductors L1(1) to L1(4) are connected to respective output terminals of the driving modules 10(1) to 10(4). Respective second terminals of the inductors L1(1) to L1(4) are all connected to an application terminal of the output voltage Vout (=a high potential terminal of the load Z). Further, due to the inductor currents IL(1) to IL(4) flowing in the inductors L1(1) to L1(4), an output current Io (=IL(1)+IL(2)+IL(3)+IL(4)) obtained by adding the inductor currents IL(1) to IL(4) can be supplied to the load Z.

The capacitor Co is connected between the application terminal of the output voltage Vout and the application terminal of the ground voltage PGND (=between two terminals of the load Z), such that the output voltage Vout becomes smooth.

Further, the unused terminals among the control terminals Tp1 to Tp8 are externally connected to an application terminal of the internal voltage Vreg15. In the example in FIG. 1, since the control terminals Tp5 to Tp8 are not used, these control terminals are connected to the application terminal of the internal voltage Vreg15.

Further, an application terminal of the ground voltage GND is connected to the ground terminal Tgd.

In addition to the integrated circuit block in the power control device 20, various protection circuits (under-voltage lock out (UVLO), over-current protection (OCP) and thermal shut down (TSD)) may also be integrated therein.

<Internal Configuration of Driving Module>

Figure 2:
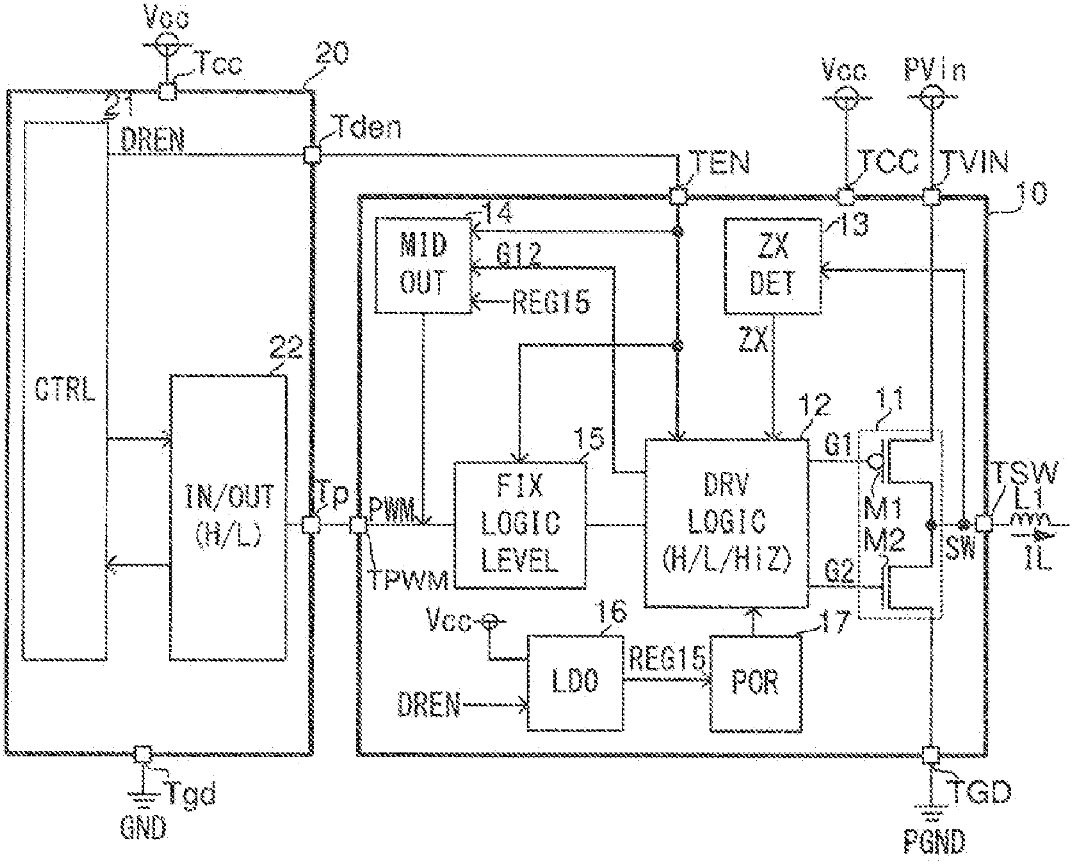
FIG. 2 is a diagram of an internal configuration example of a driving module of the switching power supply device.

FIG. 2 shows a diagram of an internal configuration example of the driving module 10 of the switching power supply device 1. Further, the driving module 10 may also be understood as any one of the four-phase driving modules 10(1) to 10(4). Similarly, a control signal PWM, a switching voltage SW, an inductor L1 and an inductor current IL are respectively equivalent to any one of the control signals PWM1 to PWM4, the switching voltages SW(1) to SW(4), the inductors L1(1) to L1(4), the inductor currents IL(1) to IL(4).

The driving module 10 of this configuration example integrated in a single package includes a switching output stage 11, a driving logic circuit 12, a zero-crossing detection circuit 13, a logic level switching circuit 14, a logic level fixing circuit 15, an LDO 16, and a power-on reset section 17. Further, the driving module 10 includes a control terminal TPWM, an enable input terminal TEN, a switching terminal TSW, a power terminal TCC, an input voltage terminal TVIN and a ground terminal TGD, and external terminals for establishing electrical connections to the exterior.

The switching output stage 11 includes an output transistor M1 as an example of a P-channel MOS transistor, and a synchronous rectifier transistor M2 as an example of an N-channel MOS transistor. The source of the transistor M1 is connected to the application terminal of the input voltage PVin via the input voltage terminal TVIN. The respective drains of the transistors M1 and M2 are connected to the switching terminal TSW serving as an application terminal (=an output terminal of the driving module 10) of the switching voltage SW. The source of the transistor M2 is connected to the application terminal of the ground voltage PGND via the ground terminal TGD.

Gate signals G1 and G2 are respectively inputted to the respective gates of the transistors M1 and M2. Further, the transistor M1 is turned on when G1=L and is turned off when G1=H. Further, the transistor M2 is turned off when G2=L and is turned on when G2=H.

For example, SW=H (PVin) when the transistor M1 is turned on and the transistor M2 is turned off. Conversely, SW=L (PGND) when the transistor M1 is turned off and the transistor M2 is turned on. Further, SW=HiZ (the output high-impedance state) when both the transistors M1 and M2 are turned off Further, as the transistor M1, an N-channel MOS transistor may also be used to substitute for the P-channel MOS transistor. However, in this case, a boost mechanism (a charge pump circuit or a bootstrap circuit) for having the H level of the gate signal G1 be higher than the input voltage PVin is needed.

Further, the transistors M1 and M2 may also be mounted at the back end of the driving module 10.

The driving logic circuit 12 generates gate signals G1 and G2 corresponding to the control signal PWM and a zero-crossing detection signal ZX. Further, the control signal PWM is inputted from the side of the power control device 20 via the control terminal TPWM. More specifically, the driving logic circuit 12 is fundamentally that, when PWM=H (e.g., Vcc), G1=G2=L, the transistor M1 is turned on and the transistor M2 is turned off; on the other hand, when PWM=L (e.g., GND), G1=G2=H, the transistor M1 is turned off, and the transistor M2 is turned on.

However, in a turned-on period of the transistor M2 (PWM=L and G1=G2=H), as the logic level for the zero-crossing detection, when the zero-crossing detection signal ZX is, for example, at the H level, the driving logic circuit 12 is G1=H and G2=L, and both the transistors M1 and M2 are turned off The zero-crossing detection circuit 13 detects the zero-crossing of the inductor current IL flowing when the transistor M2 is turned on (=the state in which the inductor current IL becomes a zero value or a near-zero value), and generates a zero-crossing detection signal ZX as a detection result thereof. For example, the zero-crossing detection signal ZX becomes the L level when no zero-crossing is detected, and becomes the H level when zero-crossing is detected.

The enable signal DREN is inputted from the side of the power control device 20 to the driving logic circuit 12 via the enable input terminal TEN. When DREN=H, the driving logic circuit 12 always operates in an operation mode of pulse driving of the switching voltage SW corresponding to the control signal PWM.

Further, when DREN=M and when zero-crossing detection of the inductor current IL is obtained by the driving logic circuit 12, the switching voltage SW is in the output high-impedance state (HiZ), and an instruction to switch the logic level is provided to the logic level switching circuit 14. The logic level switching circuit 14 receiving the instruction switches the control signal PWM to the M level (e.g., Vcc/2) that is neither the H level (e.g., Vcc) nor the L level (e.g., GND) (with the details to be described below).

Further, the logic level switching circuit 14 also switches the control signal PWM to the M level (with the details to be described below) when the driving module 10 is activated.

The logic level fixing circuit 15 is a mechanism for informing the power control device 20 of identification information (for example, information for identifying whether the driving module 10 is a large-current output type or a small-current output type) of the various model numbers (with the details to be described below).

The LDO 16 is an example of an internal voltage generating section that generates the internal voltage REG15 based on the power voltage Vcc. The internal voltage REG15 is supplied to the driving logic circuit 12, and so on. Further, for example, the internal voltage REG15 is 1.5 V, and REG15=Vcc/2.

The power-on reset section 17 is a circuit that releases the reset of the driving logic circuit 12 by means of a reset signal when the rising internal voltage REG15 has reached a specified voltage while the LDO 16 is activated.

Further, in addition to the circuit blocks integrated in the driving module 10, various protection circuits (e.g., UVLO, OCP and TSD) may also be integrated in the driving module 10.

<Logic Level Fixing Circuit>

As described above, in the driving module 10, a pull-down (FIG. 3) or pull-up (FIG. 4) logic level fixing circuit 15, as a mechanism for informing the power control device 20 of identification information of the various model numbers, is provided. In the following, the configurations and operations of the circuits are described with reference to the drawings.

Figure 3:
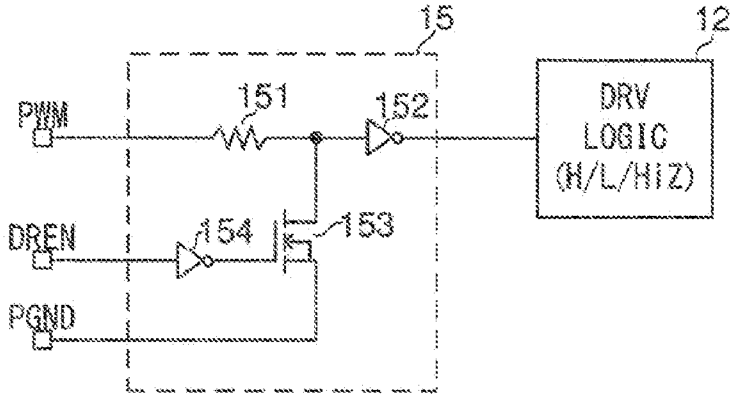
FIG. 3 is a diagram of a configuration example of a pull-down logic level fixing circuit.

FIG. 3 shows a diagram of a first configuration example (a pull-down type) of the logic level fixing circuit 15. The logic level fixing circuit 15 of this configuration example is a circuit block, for example, integrated in a large-current output type (e.g., Io=15 A) driving module 10, and includes a resistor 151, an inverter 152, an N-channel MOS transistor 153 and an inverter 154.

A first terminal of the resistor 151 is connected to an application terminal of the control signal PWM. A second terminal of the resistor 151 and an input terminal of the inverter 152 are connected to the drain of the transistor 153. An output terminal of the inverter 152 is connected to an input terminal of the driving logic circuit 12. The source and the back gate of the transistor 153 are connected to the application terminal of the ground voltage PGND. The gate of the transistor 153 is connected to an output terminal of the inverter 154. An input terminal of the inverter 154 is connected to the application terminal of the enable signal DREN.

When the enable signal DREN is at the H level or the M level (=the logic level when the driving module 10 is activated, for example, Vcc or Vcc/2), the transistor 153 is turned off. Thus, the control signal PWM is not inputted in a pulled-down manner to the driving logic circuit 12.

On the other hand, when the enable signal DREN is at the L level (=the logic level when the driving module 10 is disabled, e.g., GND), the transistor 153 is turned on. Thus, the control signal PWM is pulled down to the L level (GND).

Figure 4:
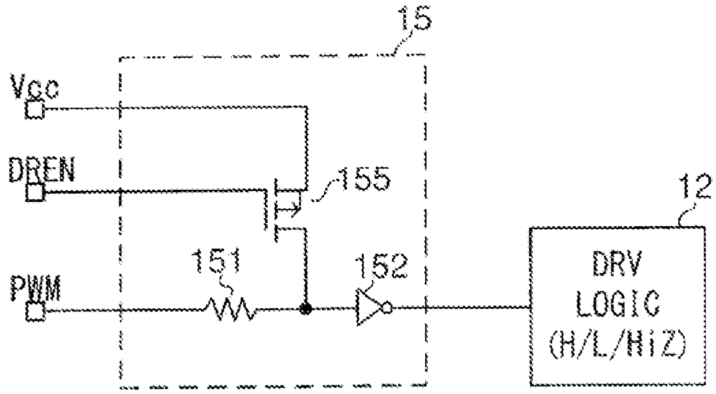
FIG. 4 is a diagram of a configuration example of a pull-up logic level fixing circuit.

FIG. 4 shows a diagram of a second configuration example (a pull-up type) of a logic level fixing circuit. The logic level fixing circuit 15 of this configuration example is a circuit block, for example, integrated in a small-current output type (e.g., Io=5 A) driving module 10, and includes a resistor 151, an inverter 152 and a P-channel MOS transistor 155.

A first terminal of the resistor 151 is connected to an application terminal of the control signal PWM. A second terminal of the resistor 151 and an input terminal of the inverter 152 are connected to the drain of the transistor 155. An output terminal of the inverter 152 is connected to an input terminal of the driving logic circuit 12. The source and the back gate of the transistor 155 are connected to the application terminal of the power voltage Vcc. The gate of the transistor 155 is connected to the application terminal of the enable signal DREN.

When the enable signal DREN is at the H level or the M level (=the logic level when the driving module 10 is activated, for example, Vcc or Vcc/2), the transistor 155 is turned off. Thus, the control signal PWM is not inputted in a pulled-up manner to the driving logic circuit 12.

On the other hand, when the enable signal DREN is at the L level (=the logic level when the driving module 10 is disabled, e.g., GND), the transistor 155 is turned on. Thus, the control signal PWM is pulled up to the H level (Vcc).

Thus, in a period in which the driving module 10 is disabled (DREN=L), in other words, in a period till the driving module 10 is activated (DREN=H or DREN=M), the logic level fixing circuit 15 fixes the control signal PWM at the logic level (the H level or L level) of each model number.

<Logic Level Switching Circuit (M Level Output Circuit)>

Figure 5:
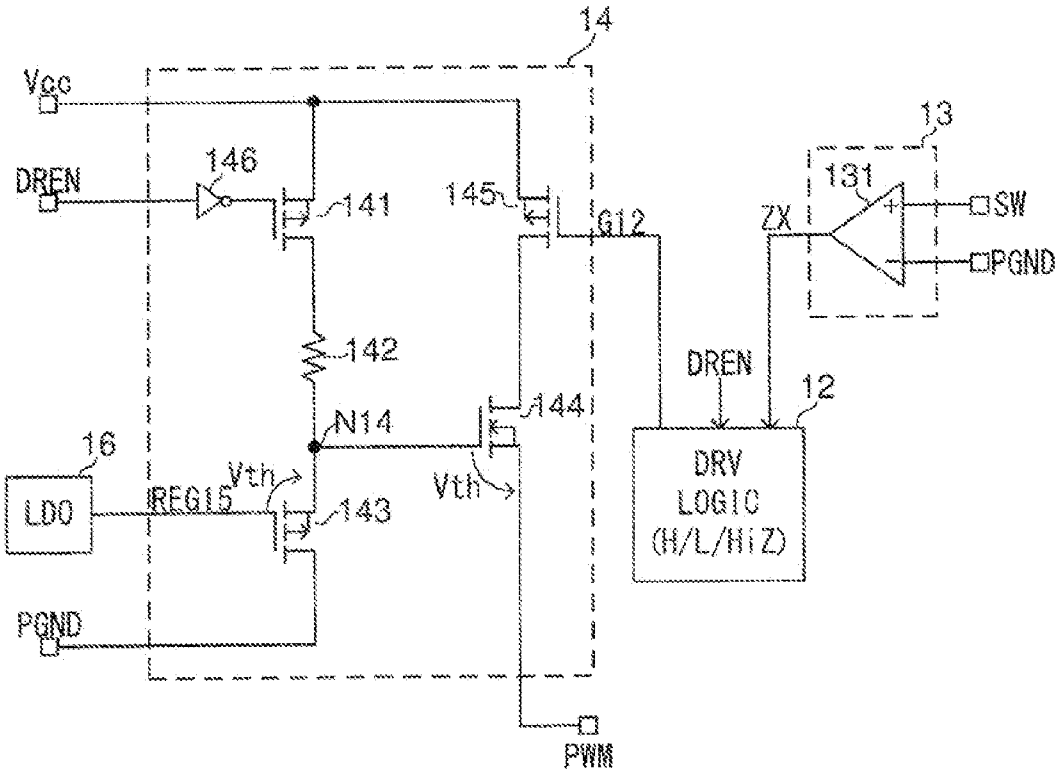
FIG. 5 is a diagram of a configuration example of a logic level switching circuit.

FIG. 5 shows a diagram of a configuration example of the logic level switching circuit 14. The logic level switching circuit 14 includes a P-channel MOS transistor 141, a resistor 142, a P-channel MOS transistor 143, an N-channel MOS transistor 144, a P-channel MOS transistor 145, and an inverter 146.

The source and the back gate of the transistor 141 are connected to the application terminal of the power voltage Vcc. The gate of the transistor 141 is connected to an output terminal of the inverter 146. An input terminal of the inverter 146 is connected to the application terminal of the enable signal DREN. The drain of the transistor 141 is connected to a first terminal of the resistor 142. A connecting node N14 of a second terminal of the resistor 142 and the source and the back gate of the transistor 143 is connected to the gate of the transistor 144. The gate of the transistor 143 is connected to an output terminal of the LDO 16. That is to say, the internal voltage REG15 outputted from the LDO 16 is applied to the gate of the transistor 143. The drain of the transistor 143 is connected to the application terminal of the ground voltage PGND. The source and the back gate of the transistor 145 are connected to the application terminal of the power voltage Vcc. The drain of the transistor 145 is connected to the drain of the transistor 144. The source and the back gate of the transistor 144 are connected to the application terminal of the control signal PWM. The gate of the transistor 145 is driven by a gate signal G12 outputted from the driving logic circuit 12.

Further, as shown in FIG. 5, the zero-crossing detection circuit 13 includes a comparator 131. A non-inverting input terminal (+) of the comparator 131 is connected to the application terminal of the switching voltage SW. An inverting input terminal (−) of the comparator 131 is connected to the application terminal of the ground voltage PGND.

In a turned-on period of the transistor M2 (PWM=L, G1=G2=H), when an inductor current IL flowing in a positive direction (=in a direction from the transistor M2 toward the inductor L1) is present, since SW<PGND, ZX=L. In this case, since the driving logic circuit 12 has the gate signal G12 at the H level, the transistor 145 is turned off, no drain current flows in the transistor 144, and a state in which PWM=L (e.g., GND) is maintained.

On the other hand, when the inductor current IL starts to flow toward the negative direction (=in a direction from the inductor L1 toward the transistor M2), since SW>PGND, ZX=H. In this case, since the driving logic circuit 12 has the gate signal G12 at the L level, the transistor 145 is turned on, a drain current flows in the transistor 144, and the source of the transistor 144 is biased toward a middle voltage VM (=REG15+Vth−Vth). By the operation above, the control signal PWM is switched from the L level (GND) to the M level (VM). The M level=REG15=Vcc/2.

Further, the driving logic circuit 12 also switches the control signal PWM to the M level when the driving module 10 is activated. Details of the above are given in the description below.

<Input/Output Circuit>

Figure 6:
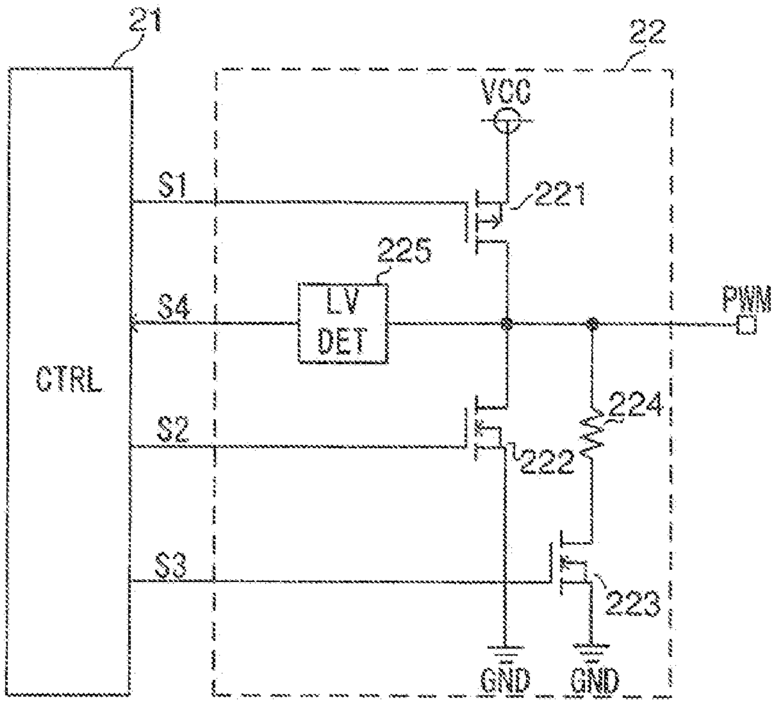
FIG. 6 is a diagram of a configuration example of an input/output circuit.

FIG. 6 shows a diagram of a configuration example of the input/output circuit 22. The input/output circuit 22 of this configuration example includes a P-channel MOS transistor

221, N-channel MOS transistors 222 and 223, a resistor 224 and a logic level detection section 225.

The source and the back gate of the transistor 221 are connected to the application terminal of the power voltage Vcc. The respective drains of the transistors 221 and 222 and a first terminal of the resistor 224 are connected to an input/output terminal of the control signal PWM. A second terminal of the resistor 224 is connected to the drain of the transistor 223. The respective sources and back gates of the transistors 222 and 223 are connected to the application terminal of the ground voltage GND.

Further, gate signals S1 to S3 are inputted to the respective gates of the transistors 221 to 223 from the control circuit 21.

For example, when the H level of the control signal PWM is outputted, S1=S2=S3=L. As a result, the transistor 221 becomes turned on, and the transistors 222 and 223 become turned off, so PWM=H (≈Vcc). On the other hand, when the L level of the control signal PWM is outputted, S1=S2=H and S3=L. As a result, the transistor 222 becomes turned on, and the transistors 221 and 223 become turned off, so PWM=L (≈GND).

Further, when the input of the control signal PWM is standby, S1=S3=H and S2=L. As a result, the transistors 221 and 222 become turned off, and the transistor 223 becomes turned on, so the control signal PWM is pulled down by the resistor 224. Thus, the control signal PWM becomes a logic level corresponding to the operation state of the logic level switching circuit 14 (FIG. 5) or the logic level fixing circuit 15 (FIG. 3 and FIG. 4) (with the details to be described below).

When the input/output circuit 22 is in the input standby state, the logic level detection section 225 detects the logic level (H/L/M) of the control signal PWM, and uses and outputs the detection result as a logic level detection signal S4 to the control circuit 21.

<Activation Steps>

The activation steps of the switching power supply device 1 are described with reference to the flowchart in FIG. 7 and the timing diagrams in FIG. 8 to FIG. 10.

Figure 8:
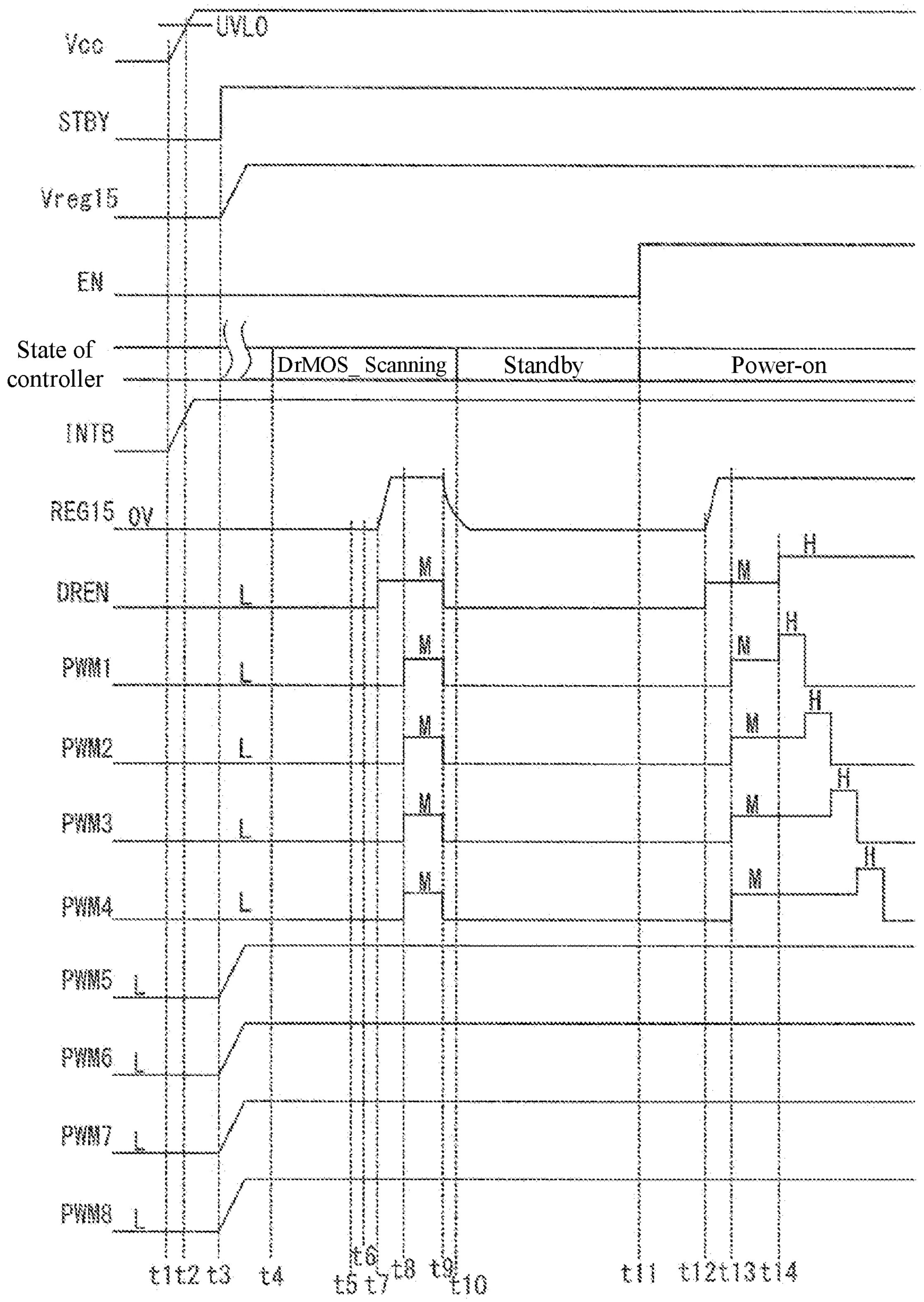
FIG. 8 is a timing diagram of a first example of activation steps of the switching power supply device (an example of normal activation).
Figure 9:
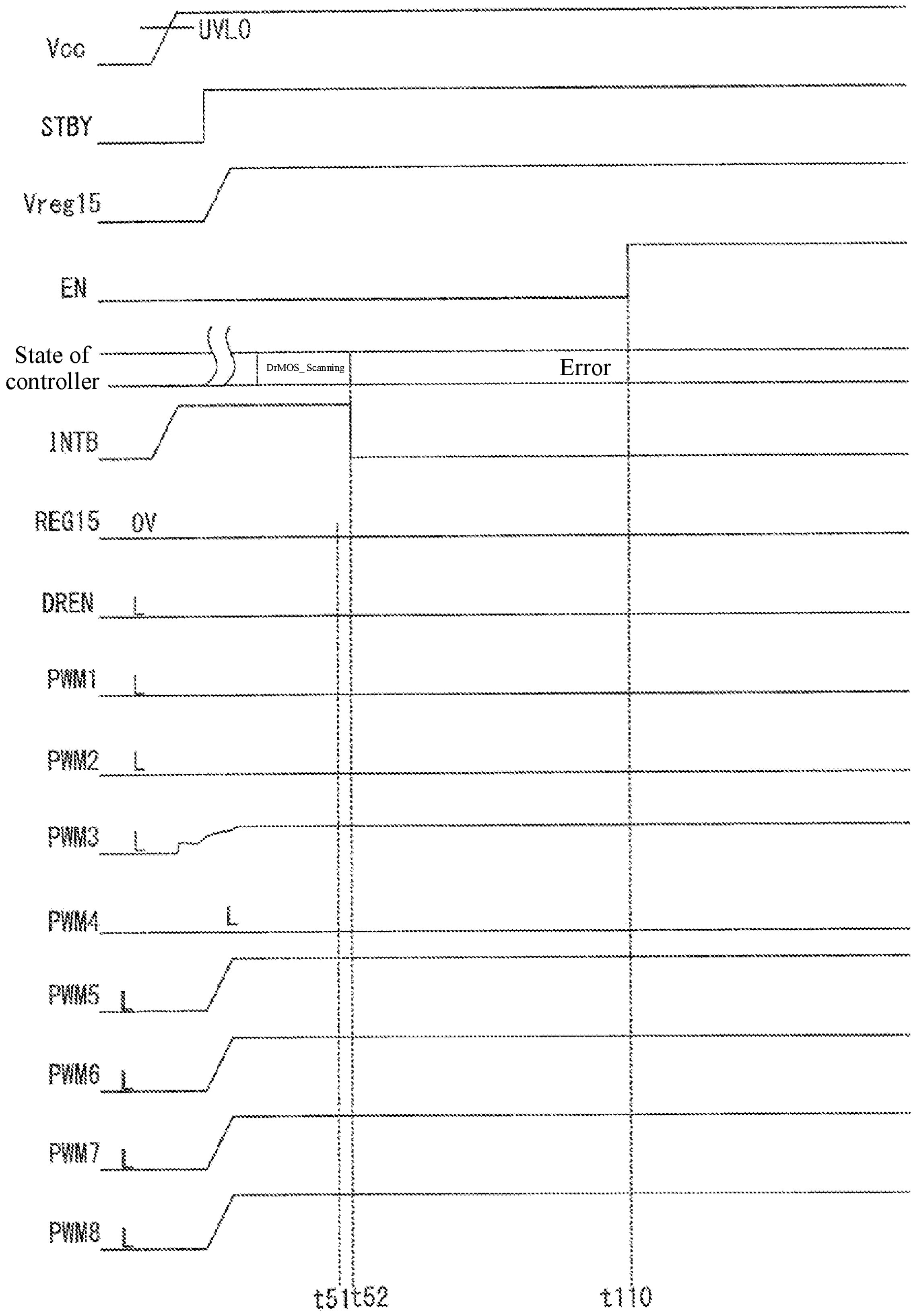
FIG. 9 is a timing diagram of a second example of activation steps of the switching power supply device (an example with the occurrence of an error).
Figure 10:
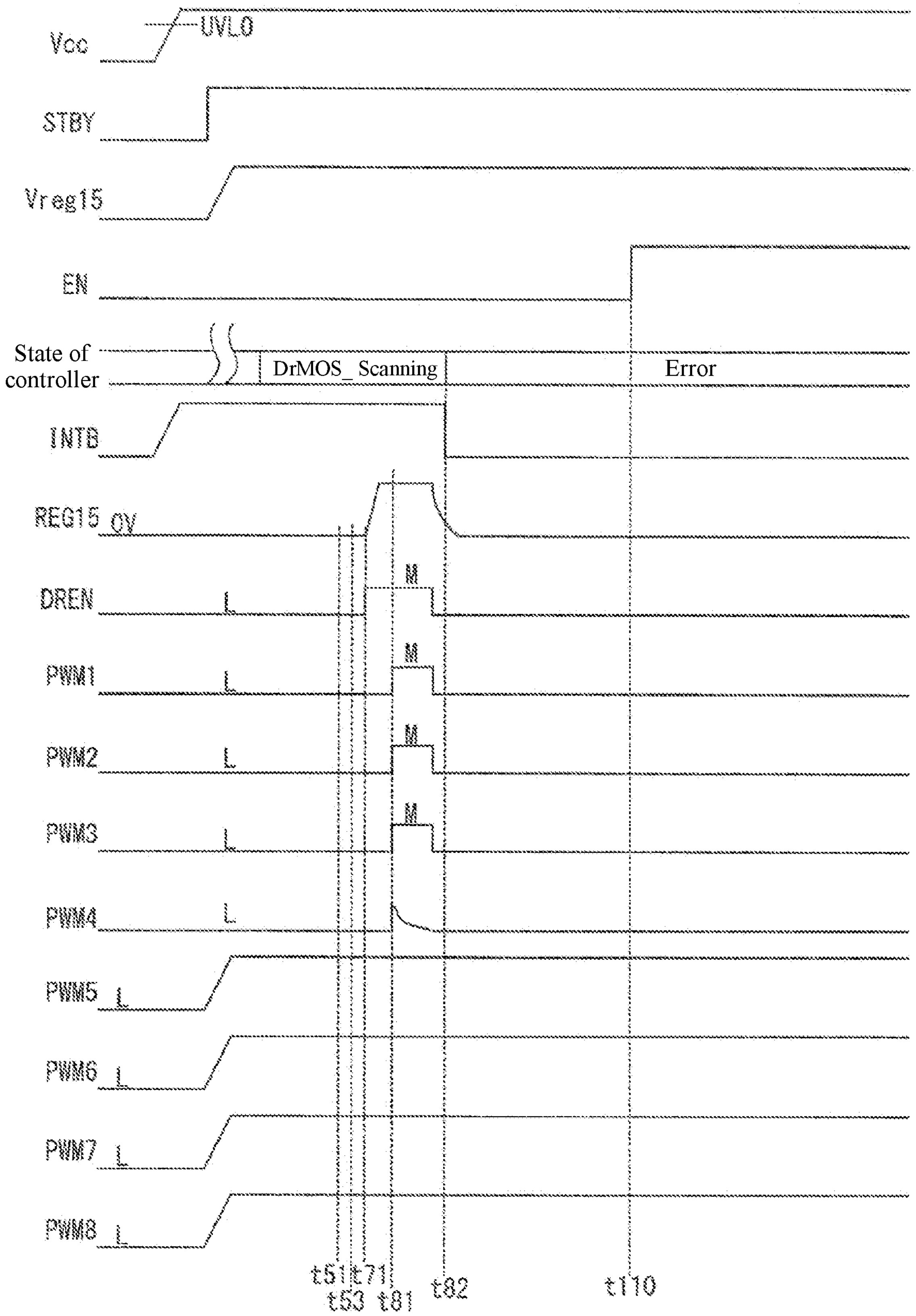
FIG. 10 is a timing diagram of a third example of activation steps of the switching power supply device (an example with the occurrence of an error).

Further, in FIG. 8 to FIG. 10, from top to bottom, waveforms of the power voltage Vcc, the standby signal STBY, the internal voltage Vreg15 (of the power control device 20), the enable signal EN, the state of the control circuit 21, the interrupt signal INTB, the internal voltage REG15 (of the driving module 10), the enable signal DREN and the control signals PWM1 to PWM8 are sequentially depicted.

Figure 7:
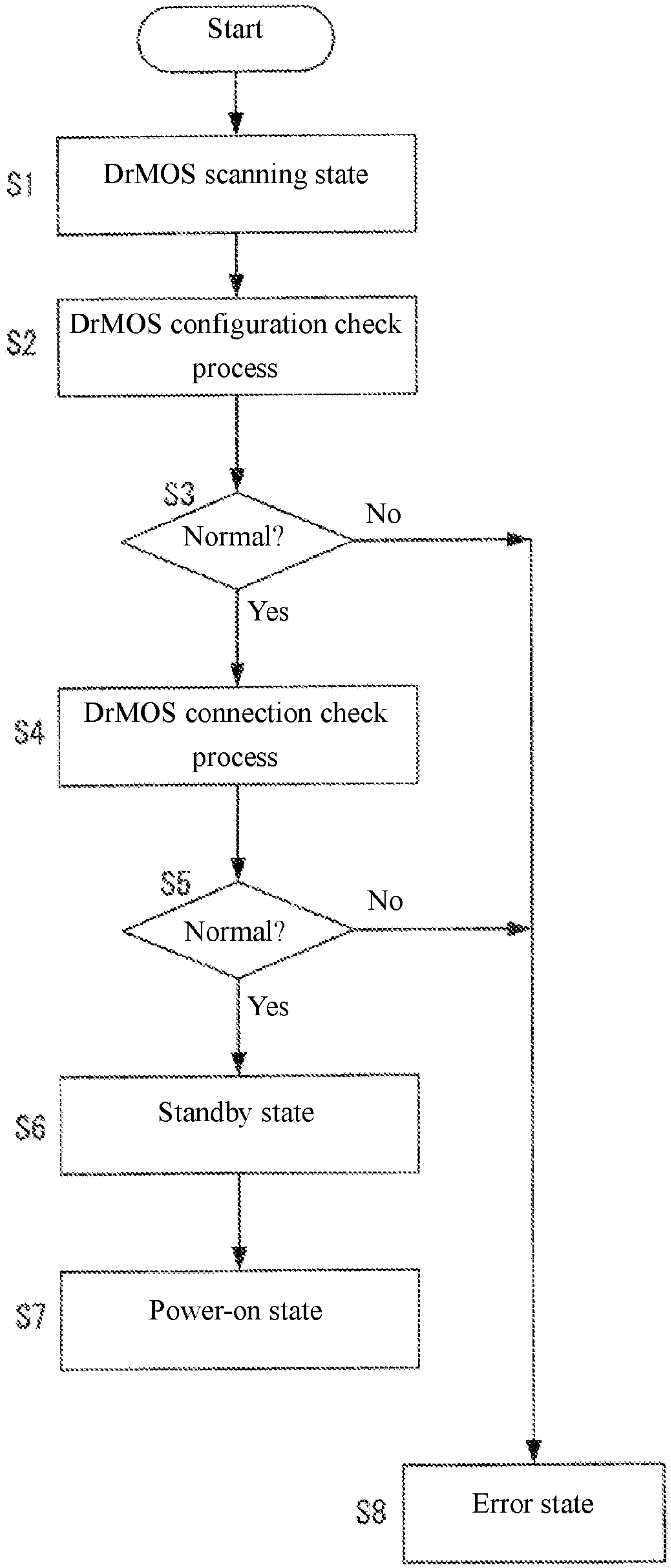
FIG. 7 is a flowchart of related activation steps of the switching power supply device.

First of all, the timing diagram in FIG. 8 is described according to the flowchart in FIG. 7. FIG. 8 represents a normal example determined in scanning of the driving module below. Further, FIG. 8 shows a situation of the driving module 10 with respect to the power control device 20 in the connection form in FIG. 1 (that is, connected to four driving modules 10).

At a timing t1 in FIG. 8, the power voltage Vcc starts rising. Then, at a timing t2, when the power voltage Vcc has reached a UVLO release voltage, the UVLO in the power control device 20 is released. Then, at a timing t3, once the standby signal STBY has risen to the H level, the internal voltage Vreg15 starts rising. Correspondingly, the control signals PWM5 to PWM8 generated by the control terminals Tp5 to Tp8 connected to the application terminal of the internal voltage Vreg15 also start rising. If the internal voltage Vreg15 rises to 1.5 V, correspondingly, the control signals PWM5 to PWM8 also rise to 1.5 V.

Further, at a timing t4, the control circuit 21 is transferred to a driving module scanning state (DrMOS_SCAN) (step S1 in FIG. 7).

Then, at a timing t5, the control circuit 21 starts a driving module configuration check process (step S2 in FIG. 7). At a timing t5, the enable signal DREN becomes the L level. Herein, in the example in FIG. 8, the logic level fixing circuit 15 in the driving module 10 is a pull-down type (FIG. 3), so the control signals PWM1 to PWM4 become the L level by means of pull-down. Further, all the control signals PWM5 to PWM8 become 1.5 V (the M level).

In the driving module configuration check process, the control circuit 21 checks whether any one of the control terminals Tp1 to Tp8 is used to connect to the driving module 10. More specifically, the control circuit 21 verifies whether a combination of each level of the control signals PWM1 to PWM8 is consistent with a predetermined permitted combination. At this point in time, since the input/output circuit 22 of the power control device 20 is in the input standby state, the logic level (H/L/M) of the control signal PWM is detected.

For example, when one driving module 10 is connected, among the control terminals Tp1 to Tp8, connection to only the control terminal Tp1 is permitted. Thus, as a permitted combination of the level of the control signal, "control signal PWM=L or H, and control signals other than PWM1=M". Further, when two driving modules 10 are connected, among the control terminals Tp1 to Tp8, connection to only the control terminals Tp1 and Tp2 is permitted. Thus, as a permitted combination of the level of the control signal, "both control signals PWM 1 and PWM2=L or both=H, and control signals other than PWM1 and PWM2=M". Similarly, permitted combinations for connecting to eight driving modules 10 at most are predetermined.

Taking FIG. 8 for example, the actual level combination of the control signal PWM is consistent with the permitted combinations such as "PWM1 to PWM4=L, PWM5 to PWM8=M", "all PWM1 to PWM4=L or all=H, and control signals other than PWM1 to PWM4=M", so it is determined that the control terminals Tp1 to Tp4 are used for connection, and terminals other than those are not used.

Herein, since the logic level fixing circuit 15 is a pull-down type (FIG. 3) when PWM=L, for example, the driving module 10 can be determined as a large-current output type. On the other hand, since the logic level fixing circuit 15 is a pull-up type (FIG. 4), when PWM=H, for example, the driving module 10 can be determined as a small-current output type. For the example in FIG. 8, PWM1 to PWM4=L, and thus it can be determined that the driving modules 10 respectively connected to the control terminals Tp1 to Tp4 are a large-current output type. Further, setting the permitted level combination as "all" set to L or "all" set to H is to prohibit the use of some of the driving modules 10 in different model numbers.

By determining the model number of the driving module 10 as above, the control parameter (such as a feedback coefficient of the output current feedback circuit or a phase compensation amount) of the power control device 20 can be switched to an optimal value.

Further, because the actual number of driving phases (four phases in the example in FIG. 8) can be determined, corresponding phase shift control can be performed (with the details to be described below).

In FIG. 8, the driving module configuration check process ends at a timing t6, and in this case, it is determined that the driving module configuration is normal (Yes (Y) as a result of step S3 in FIG. 7), and the control circuit 21 transfers to the driving module connection check process (step S4 in FIG. 7).

Herein, when the driving module configuration check process yields a normal result, it is possible that poor connections of the control terminals (Tp1 to Tp8) are still generated. For example, it is possible that the connection between the control terminal and the driving module 10 is disconnected, or an open-circuit fault exists in the control terminal. In this case, during the driving module configuration check process, the level of the control signal may occasionally become a level that is determined as normal. In FIG. 8, for example, although a poor connection may in fact occur in at least any one of the control terminals Tp1 to Tp4, the levels of the control signals PWM1 to PWM4 may occasionally become L.

Thus, in this embodiment, after the driving module configuration check process, the driving module connection check process is implemented in order to determine whether a poor connection exists in the control terminal. In FIG. 8, if the driving module connection check process is started, the control circuit 21 has the enable signal DREN rise to the M level at a timing t7. Thus, the LDO 16 in the driving module 10 is activated, and the internal voltage REG15 starts rising.

The transistor 141 in the logic level switching circuit 14 (FIG. 5) is turned on by means of the enable signal DREN at the M level. Accordingly, a constant current circuit including the transistor 141 and the resistor 142 is conducted. Further, since the internal voltage REG15 rises to 1.5 V, the voltage (=internal voltage REG15) applied to the gate of the transistor 143 in the logic level switching circuit 14 also rises to 1.5 V.

Once the internal voltage REG15 has reached a specified voltage lower than 1.5 V, the power-on reset section 17 releases the reset of the driving logic circuit 12 by means of the reset signal. At this point in time, after the time of delaying the internal process of the power-on reset section 17 has lapsed subsequent to the internal voltage REG15 reaching the specified voltage, the driving logic circuit 12 is released from reset.

When the reset of the driving logic circuit 12 is released at the timing t8, the driving logic circuit 12 outputs the gate signal G12 at the L level to the logic level switching circuit 14. Accordingly, the transistor 145 becomes turned on, and the control signal PWM is switched to the M level.

At this point in time, since the input/output circuit 22 of the power control device 20 is in the input standby state, the logic level (H/L/M) of the control signal PWM is detected. The control circuit 21 determines whether the control signals PWM of all the control terminals previously determined as being in use in the driving module configuration check process are at the M level. If all are at the M level, it is determined that no poor connection exists in the control terminals determined as being in use, and a normal state is determined. In the example in FIG. 8, since all the control signals PWM1 to PWM4 of the control terminals Tp1 to Tp4 determined as being in use, a normal state is determined.

Further, the driving logic circuit 12 switches to the H level after having the gate signal G12 become the L level. Thus, the control signal PWM becomes a state in which the M level is maintained by using only the source ability of the logic level switching circuit 14. Therefore, subsequent behaviors of the control signal PWM are not affected.

In FIG. 8, at a timing t9, the control circuit 21 has the enable signal DREN drop to the L level, so the LDO 16 stops and the internal voltage REG15 drops. Accordingly, the driving logic circuit 12 is reset by the power-on reset section 17. Further, because the enable signal DREN drops to the L level, the control signals PWM1 to PWM4 become the L level by means of the logic level fixing circuit 15.

As shown in FIG. 8, when it is determined as normal in the driving module connection check process (Yes as a result of step S5 in FIG. 7), the control circuit 21 transfers to a standby state (STANDBY) (step S6 in FIG. 7, at a timing t10).

Then, when the enable signal DREN rises to the H level, the control circuit 21 transfers to the power-on state (POWER_ON) (step S7 in FIG. 7, at a timing t11). Further, in FIG. 8, after transferring to the power-on state, the control circuit 21 has the enable signal DREN rise to the M level at a timing t12. Thus, similar to the operation at the timing t7, the internal voltage REG15 starts rising, and the reset of the driving logic circuit 12 is released by the power-on reset section 17 at a timing t13 subsequent to a delay from the timing t12. Accordingly, similar to the description above, the logic level switching circuit 14 switches the control signal PWM to the M level according to the gate signal G12 at the L level outputted from the driving logic circuit 12. Further, the driving logic circuit 12 switches to the H level after having the gate signal G12 become the L level. Thus, the control signal PWM becomes a state in which the M level is maintained by using only the source ability of the logic level switching circuit 14. Therefore, subsequent behaviors of the control signal PWM are not affected.

At a timing t14 later than the timing t13, the control circuit 21 has the enable signal DREN rise to the H level. Thus, the input/output circuit 22 of the power control device 20 is fixed at the output state (=the transistor 223 in FIG. 6 is turned off, and the logic level detection section 225 is in an ineffective state). Further, the driving logic circuit 12 operates by the first operation mode (=an operation mode in which pulse driving of the switching voltage SW is always performed according to the control signal PWM). The switching pulse of the control signal PWM is continuously generated at a fixed switching frequency, and the driving logic circuit 12 drives the switching output stage 11 according to the level of the control signal PWM. Accordingly, even when the load Z becomes light, the switching power supply device 1 does not switch from a heavy-load mode (PWM mode) to a light-load mode (PFM mode).

Further, as shown in FIG. 8, phase shift control is performed, that is, the control signal PWM is generated simultaneously while the phase is being shifted.

Further, although not shown in FIG. 8, when the enable DREN is switched to the M level from the H level, the driving module 10 is activated by the second operation mode (=an operation mode in which the control signal PWM is automatically switched to the M level, and the switching voltage SW is automatically in an output high-impedance state (HiZ), during zero-crossing detection of the inductor current IL).

In this case, after the control signal PWM switches from the H level to the L level, the input/output circuit 22 of the power control device 20 is switched to the input standby state at an appropriate timing, and becomes a state of detecting the logic level (H/L/M) of the control signal PWM.

Since the control signal PWM is at the L level, the zero-crossing detection signal ZX rises to the H level during a turned-on period of the transistor M2, and the driving logic circuit 12 has the gate signal G12 become the L level when zero-crossing of the switching voltage SW is detected. Thus, the logic level switching circuit 14 switches the control signal PWM to the M level.

When the control signal PWM is switched from the L level to the M level, by identifying zero-crossing of the inductor current IL detected in the driving module 10 in the control circuit 21, the switching power supply device 1 can be transferred from the heavy-load mode (PWM mode) to the light-load mode (PFW mode) without delay. Therefore, switching pulses of the control signal PWM can be reduced and efficiency during a light load can be enhanced.

Further, certainly that when the driving module 10 is activated by the second operation mode (DREN=M), given that the zero-crossing detection signal ZX rises to the H level, the control signal PWM is not required to switch to the M level, and the switching power supply device 1 is not required to switch from the heavy-load mode (PWM mode) to the light-load mode (PFM mode).

Next, the timing diagram in FIG. 9 is described below. In FIG. 9, the driving module configuration check process begins at the timing t51; however, at this point in time, the control signal PWM3 does not become the L level due to a poor connection in the control terminal Tp3. Thus, the control circuit 21 determines that each of the level combinations of the control signals PWM1 to PWM8 is not consistent with any one of the predetermined permitted combinations, and an abnormal state is determined (No (N) as a result of step S3 in FIG. 7).

Accordingly, at a timing t52 in FIG. 9, the control circuit 21 transfers to an error state (ERROR), and the MOS switch 24 becomes turned on, and accordingly the interrupt signal INTB drops to the L level. The exterior is informed of the abnormality by means of the interrupt signal INTB.

Then, as shown in FIG. 9, although the enable signal EN rises to the H level (at a timing t110), the control circuit 21 is still in the error state, so the enable signal DREN is kept at the L level, such that the driving module 10 is not activated and the switching operation of the switching power supply device 1 is not performed.

Further, for example, even when the control terminal Tp3 corresponding to the control signal PWM3 is connected to the driving module 10 of the pull-up logic level fixing circuit 15, the control signal PWM3 is also at the H level, and thus an abnormal state is determined in the driving module configuration check process.

Thus, in the driving module configuration check process, the switching operation of the switching power supply device 1 can be avoided when the state of use of non-permitted control terminals is determined.

Next, the timing diagram in FIG. 10 is described below. In FIG. 10, the driving module configuration check process begins at the timing t51; however, at this point in time, all the control signals PWM1 to PWM4 are at the L level. Thus, the control circuit 21 determines that each of the level combinations of the control signals PWM1 to PWM8 is consistent with the predetermined permitted combinations, and a normal state is determined (Yes as a result of step S3 in FIG. 7).

However, in FIG. 10, in the example in which a poor connection actually occurs in the control terminal Tp4 corresponding to the control signal PWM4, the control signal PWM4 occasionally becomes the L level in the driving module configuration check process.

At a timing t53, the driving module configuration check process ends, and the driving module connection check process begins (step S4 in FIG. 7). At a timing t71, the enable signal DREN rises to the M level, the logic level switching circuit 14 switches the control signal PWM to the M level (at a timing t81) by the reset-released driving logic circuit 12. However, in FIG. 10, as described above, due to the poor connection in the control terminal Tp4, the control signal PWM4 generates an abnormality of the level having dropped from the M level. Thus, the control circuit 21 is determined as being in an abnormal state (N as a result of step S5 in FIG. 7).

The control circuit 21 has the enable signal DREN drop to the L level, and then transfers to the error state (step S8 in FIG. 7) at a timing t82.

With the transfer to the error state, even when the enable signal EN rises to the H level (at a timing t110), the control circuit 21 still keeps the enable signal DREN at the L level, such that the driving module 10 is not activated and the switching operation of the switching power supply device 1 is not performed.

Thus, when a poor connection exists in the control terminal, even if it is occasionally determined as normal in the driving module configuration check process, the poor connection can be detected in the driving module connection check process, thus preventing the switching operation of the switching power supply device 1.

As described above, in this embodiment, by using the control signal PWM for alternative purposes, that is, performing the driving module configuration check process and the driving module connection check process, the state of use of the control terminal, the model number of the connected driving module and whether a poor connection that occurs in the control terminal can be verified. Further, by using the control signal PWM for alternative purposes, zero-crossing detection notification can be provided from the driving module 10 to the power control device 20. Therefore, the increase in the number of terminals of the power control device 20 and the driving module 10 can be suppressed.

<Power Control Device for Multiple Channels>

Further, as a variant embodiment, the power control device 20 may also control driving modules 10 in multiple channels. Associated details are given in the description below.

Figure 11:
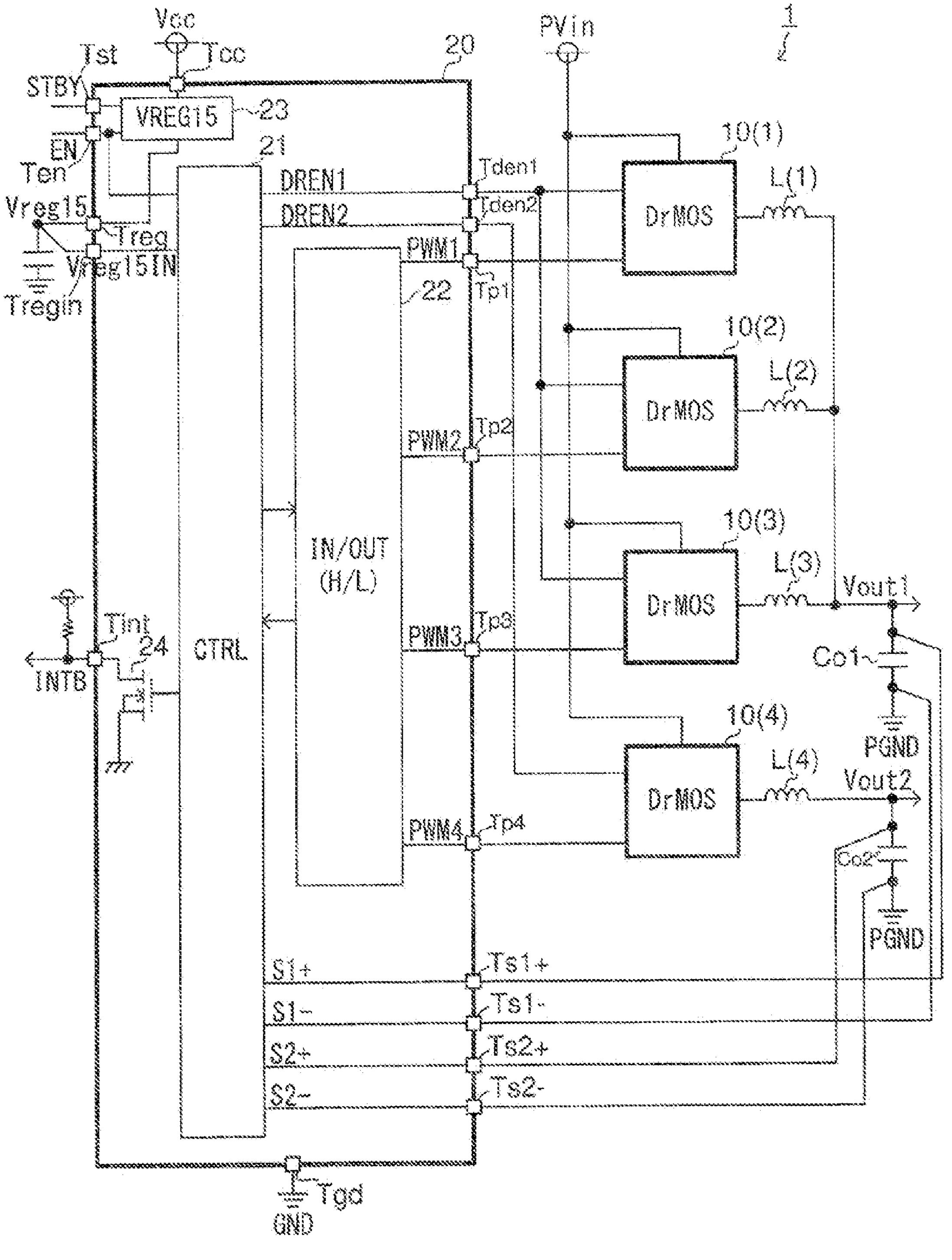
FIG. 11 is a diagram of an overall configuration of a switching power supply device according to a variant embodiment.

FIG. 11 shows a diagram of a configuration of the switching power supply device 1 as an example including the power control device 20 for controlling driving modules 10 in multiple channels. FIG. 11 shows an example of the power control device 20, which corresponds to two channels. Further, the so-called "channel" is equivalent to the number of enable signals DREN that can be outputted.

The power control device 20 shown in FIG. 11 includes enable output terminals Tden1 and Tden2, the control circuit 21 can output an enable signal DREN1 from the enable output terminal Tden1 and output an enable signal DREN2 from the enable output terminal Tden2. Further, as an example, the power control device 20 in FIG. 11 includes control terminals Tp1 to Tp4, and can output control signals PWM1 to PWM4 via the control terminals Tp1 to Tp4. That is to say, the power control device 20 can use two channels to control the four-phase driving modules 10.

Further, as an example, in FIG. 11, the control terminals Tp1 to Tp3 are respectively connected to the driving modules 10(1) to 10(3) connected to the enable output terminal Tden1(1*ch*). Further, the control terminal Tp4 is connected to the driving module 10(4) connected to the enable output terminal Tden2(2*ch*). That is to say, three phases (1*ch*) and one phase (2*ch*) are used.

The driving modules 10(1) to 10(3) of the same channel (1*ch*) are respectively connected to first terminals of the inductors L1(1) to L1(3), and second terminals of the inductors L1(1) to L1(3) are connected in common to the first terminal of a capacitor Col. A first terminal of the capacitor Col becomes an application terminal of an output voltage Vout1. Further, the driving module 10(4) of the other same channel (2*ch*) is connected to a first terminal of the inductor L1(4), and a second terminal of the inductor L1(4) is connected to a first terminal of a capacitor Co2. A first terminal of the capacitor Co2 becomes an application terminal of an output voltage Vout2. That is to say, each channel forms a DC/DC converter.

Further, in addition to the form shown in FIG. 11, for example, a connection form of using the driving module 10 in four phases (1*ch*) and 0 phase (not using 2*ch*), or two phase (1*ch*) and two phases (2*ch*) can also be used. Further, the unused terminals among the control terminals Tp1 to Tp4 are, similar to the embodiment, connected to an application terminal of the internal voltage Vreg15, and the control signal PWM is set to the M level.

Figure 12:
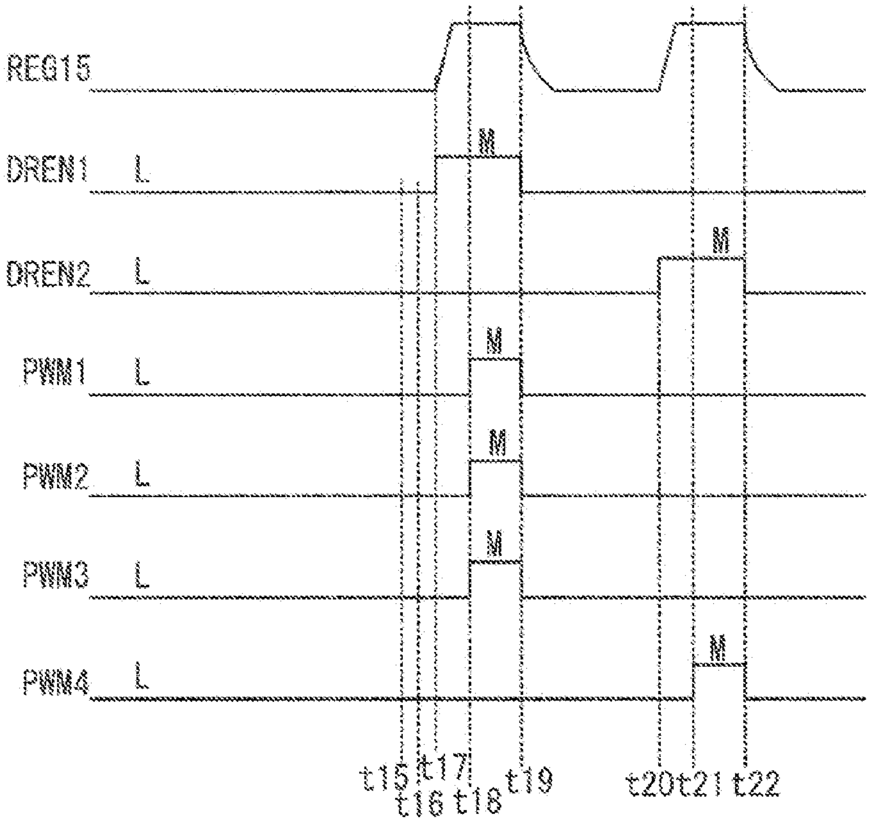
FIG. 12 is a timing diagram of an example of activation steps of the configuration shown in FIG. 11.

Herein, FIG. 12 shows a timing diagram of an example of activation steps of the configuration shown in FIG. 11. In FIG. 12, from top to bottom, waveforms of the internal voltage REG15, the enable signals DREN1 and DREN2 and the control signals PWM1 to PWM4 on the side of the driving module 10 are sequentially depicted.

At a timing t15 in FIG. 12, the driving module configuration check process begins. At this point in time, since both the enable signals DREN1 and DREN2 are at the L level, the logic level fixing circuit 15 on the side of the drive module 10 informs the control circuit 21 of the levels of the control signals PWM1 to PWM4 via the input/output circuit 22 in the input standby state. FIG. 12 shows an example in which all the driving modules 10(1) to 10(4) have the pull-down logic level fixing circuit 15 in the configuration shown in FIG. 11, and all the control signals PWM1 to PWM4 are at the L level.

In the driving module configuration check process, as described above, the control circuit 21 verifies whether the combination of the levels the control signals PWM is consistent with a permitted combination. In FIG. 12, since all the control signals PWM1 to PWM4 are in an L combination that is consistent with the permitted combination, a normal state is determined. Further, assuming that the combination of the levels of the control signals PWM1 to PWM4 is not consistent with the permitted combination, an abnormal state is determined. Similar to the above embodiment, the control circuit 21 transfers to the error state.

In FIG. 12, at a timing t16, the driving module configuration check process ends, and the driving module connection check process begins. Then, at a timing t17, the control circuit 21 has only the enable signal DREN1 between the enable signals DREN1 and DREN2 rise to the M level. Accordingly, the internal voltage REG15 in each of the driving modules 10(1) to 10(3) corresponding to the enable signal DREN1 rises, reset of each driving logic circuit 12 is released, and the control signals PWM1 to PWM3 are switched to the M level by the individual logic level switching circuits 14. Accordingly, the control terminals Tp1 to Tp3 connected to the driving modules 10 of 1*ch* can be identified.

At a timing t19, the enable signal DREN1 is made to drop to the L level by the control circuit 21, and the control signals PWM1 to PWM3 drop to the L level. Then, at a timing t20, the control circuit 21 has only the enable signal DREN2 between the enable signals DREN1 and DREN2 rise to the M level. Accordingly, the internal voltage REG15 in the driving module 10(4) corresponding to the enable signal DREN2 rises, reset of the driving logic circuit 12 is released, and the control signal PWM4 is switched to the M level (at a timing t21) by the logic level switching circuit 14. Accordingly, the control terminal Tp4 connected to the driving module 10 of 2*ch* can be identified.

Thus, in this embodiment, by using the control signal PWM for alternative purposes, the number or connecting terminals of the driving module 10 of each channel can be automatically identified, and the number of terminals of the power control device 20 and the driving module 10 can be suppressed from increasing. For example, in the power control device 20, the following approach may also be considered: providing a new setting terminal, performing voltage dividing of the terminal by changing an external voltage divider ratio, monitoring the divided voltage by an analog-to-digital converter (ADC) in the power control device 20, and accordingly detecting the connection form; however, the number of terminals also increases in response to the number of the new terminal.

Further, in this embodiment, even if the number of channels or phases is increased, it is not required to increase the number of terminals.

<Other>

Further, in addition to the embodiments, various modifications may be made to the technical features disclosed by the present disclosure without departing from the scope of the technical inventive subject thereof. That is to say, it should be understood that all aspects of the embodiment are illustrative rather than restrictive, and it should also be understood that the technical scope of the present disclosure is not limited to the embodiments, but includes all meanings equivalent to the claims and all changes within the technical scope.

For example, in the driving module connection check process, the control circuit 21 is not limited to having the enable signal DREN (DREN1 and DREN2) become the M level, as long as it is a level capable of activating the driving module 10, for example, rising up to the H level.

Further, the switching power supply device of the present disclosure can be, for example, preferably mounted in a vehicle. The failure detection associated with the control terminal has been required by the international standard ISO26262 for the electrical/electronic related functional safety of automobiles; from this perspective, the effects of the present disclosure are even more important.

INDUSTRIAL APPLICABILITY

The present disclosure can be used in a multi-phase switching power supply device supplying power to, for example, a load (such as CPU) that consumes a large current.

What is claimed is:

1. A power control device, used with a driving module that drives an output transistor and a synchronous rectifier transistor to turn on or off, the power control device comprising:

a control terminal, configured to input and output a control signal to and from the driving module;

an enable output terminal, configured to output an enable signal to the driving module;

a control circuit; and an input/output circuit, configured to have the control signal be a first logic level when the output transistor is turned on and the synchronous rectifier transistor is turned off, and to have the control signal be a second logic level when the output transistor is turned off and the synchronous rectifier transistor is turned on, and to be in an input standby state according to an instruction from the control circuit;

wherein the control circuit is configured to activate the enable signal at a level of the driving module to be transmitted to the driving module to verify whether the control signal is at a third logic level that is neither the first logic level nor the second logic level when the input/output circuit is in the input standby state.

2. The power control device according to claim 1, wherein the enable signal is configured to be any one of an L (low) level, an H (high) level or an M level between the L level and the H level to activate the level of the driving module to be the M level.

3. The power control device according to claim 1, wherein when the input/output circuit is in the input standby state and the enable signal is at a level representing disablement, after the control circuit verifies that the control signal has become the first logic level or the second logic level, the control circuit is configured to activate the enable signal at the level of the driving module to be transmitted to the driving module.

4. The power control device according to claim 3, wherein the control terminal is plural in quantity, and when the input/output circuit is in the input standby state and the enable signal is at the level representing disablement, the control circuit verifies whether a combination of the level of the control signal is consistent with a permitted combination.

5. The power control device according to claim 4, wherein an application terminal of a voltage at the third logic level is configured to be connected to the control terminal that is not used for connection with the driving module.

6. The power control device according to claim 1, wherein the enable output terminal is plural in quantity, and the control terminal is plural in quantity.

7. A driving module, driving an output transistor and a synchronous rectifier transistor to turn on or off, and integrated in a single package, comprising:

a driving logic circuit, configured to turn on the output transistor and to turn off the synchronous rectifier transistor when the control signal is at a first logic level, and to turn off the output transistor and to turn on the synchronous rectifier transistor when the control signal is at a second logic level;

an internal voltage generating section, generating an internal voltage and activated by an enable signal;

a power-on reset section, releasing reset of the driving logic circuit according to the internal voltage; and a logic level switching circuit, switching the control signal to a third logic level that is neither the first logic level nor the second logic level according to an instruction from the driving logic circuit when the reset is released.

8. The driving module according to claim 7, wherein the logic level switching circuit comprises:

a first P-channel MOS transistor, having a gate driven based on the enable signal, and a source connected to an application terminal of a power voltage;

a resistor, having a first terminal connected to a drain of the first P-channel MOS transistor;

a second P-channel MOS transistor, having a source connected to a second terminal of the resistor, a drain connected to an application terminal of a ground voltage, and a gate driven by the internal voltage;

an N-channel MOS transistor, having a gate connected to a connecting node of the second terminal of the resistor and the source of the second P-channel MOS transistor, and a source connected to an application terminal of the control signal; and a third P-channel MOS transistor, having a source connected to the application terminal of the power voltage, a drain connected to the drain of the N-channel MOS transistor, and a gate applied with a gate signal outputted from the driving logic circuit.

9. The driving module according to claim 7, further comprising a logic level fixing circuit, wherein the logic level fixing circuit fixes the control signal at the logic level of each model number when the enable signal represents disablement.

10. The driving module according to claim 7, further comprising a zero-crossing detection circuit, wherein the zero-crossing detection circuit detects zero-crossing of a flowing inductor current when the synchronous rectifier transistor is turned on, and wherein the logic level switching circuit switches the control signal to the third logic level according to the instruction from the driving logic circuit upon detection of zero-crossing.

11. The driving module according to claim 7, wherein the power control device is integrated in a package including the output transistor and the synchronous rectifier transistor.

12. A switching power supply device, comprising a driving module and a power control device, the driving module driving an output transistor and a synchronous rectifier transistor to turn on or off, and the power control device comprising:

a control terminal, configured to input and output a control signal to and from the driving module;

an enable output terminal, configured to output the enable signal to the driving module;

a control circuit; and an input/output circuit, configured to have the control signal be a first logic level or a second logic level in order to turn on or turn off the output transistor and the synchronous rectifier transistor, and to be in an input standby state according to an instruction from the control circuit;

wherein the control circuit is configured to transmit an enable signal at a level for activating the driving module to the driving module when the input/output circuit is in the input standby state, and to verify whether the control signal is at a third logic level that is neither the first logic level nor the second logic level; and the driving module integrated in a single package comprises:

a driving logic circuit, configured to turn on the output transistor and to turn off the synchronous rectifier transistor when the control signal is at the first logic level, and to turn off the output transistor and to turn on the synchronous rectifier transistor when the control signal is at the second logic level;

an internal voltage generating section, generating an internal voltage and activated by the enable signal;

a power-on reset section, releasing reset of the driving logic circuit according to the internal voltage; and the logic level switching circuit, switching the control signal to the third logic level according to the instruction from the driving logic circuit when the reset is released.

* * * * *